United States Patent
Wariishi et al.

(10) Patent No.: US 7,497,965 B2
(45) Date of Patent: Mar. 3, 2009

(54) INSULATING FILM-FORMING COMPOSITION, INSULATING FILM AND PRODUCTION METHOD THEREOF

(75) Inventors: Koji Wariishi, Shizuoka (JP); Katsuyuki Watanabe, Shizuoka (JP); Kazutaka Takahashi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 266 days.

(21) Appl. No.: 11/502,389

(22) Filed: Aug. 11, 2006

(65) Prior Publication Data

US 2007/0034992 A1    Feb. 15, 2007

(30) Foreign Application Priority Data

Aug. 11, 2005   (JP) ............................ P2005-233294

(51) Int. Cl.
| | |
|---|---|
| *E04B 1/62* | (2006.01) |
| *E04B 1/74* | (2006.01) |
| *C08G 77/48* | (2006.01) |
| *C08L 83/14* | (2006.01) |
| *C09D 1/00* | (2006.01) |
| *C09D 5/25* | (2006.01) |
| *C09D 183/14* | (2006.01) |

(52) U.S. Cl. .............. 252/62; 106/287.1; 106/287.13; 106/287.14; 106/287.15; 106/287.16; 427/384; 427/387; 428/447

(58) Field of Classification Search .............. 106/287.1, 106/287.13, 287.14, 287.15, 287.16; 252/62; 427/387, 384; 428/447

See application file for complete search history.

(56) References Cited

U.S. PATENT DOCUMENTS

2007/0020467 A1 * 1/2007 Nakagawa et al. .......... 428/447

FOREIGN PATENT DOCUMENTS

| EP | 1705206 A1 * | 9/2006 |
| WO | WO2005068538 A1 * | 7/2005 |
| WO | WO2005068540 A1 * | 7/2005 |

OTHER PUBLICATIONS

Landskron et al. "Periodic Mesoporous Organosilicas Containing Interconnected [Si(CH$_2$)]$_3$ Rings," Science vol. 302, No. 5643, pp. 266-269, Oct. 10, 2003, American Association for the Advancement of Science.

* cited by examiner

*Primary Examiner*—Anthony J Green
(74) *Attorney, Agent, or Firm*—Sughrue Mion, PLLC

(57) ABSTRACT

An insulating film-forming composition comprising: at least one of a compound represented by formula (1) as defined in the specification, a hydrolysate and a condensate thereof; and at least one solvent, wherein the at least one solvent contains an organic solvent(s) having a boiling point of 85 to 250° C. in an amount of 25 mass % or more; a method for producing an insulating film by using the composition; and the insulating film.

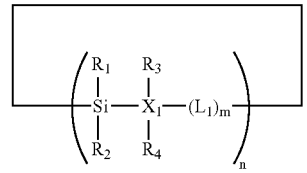

(1)

11 Claims, No Drawings

INSULATING FILM-FORMING COMPOSITION, INSULATING FILM AND PRODUCTION METHOD THEREOF

BACKGROUND OF THE INVENTION

1. Field of the Invention

The present invention relates to a composition useful for the formation of an insulating material. More specifically, the present invention relates to an insulating film-forming composition ensuring that a coat having an appropriate uniform thickness can be formed as an interlayer insulating film material, for example, in a semiconductor device and the dielectric properties and the like are excellent. The present invention also relates to a production method of an insulating film, and an insulating film.

2. Description of the Related Art

Conventionally, a silica ($SiO_2$) film formed by a vacuum process such as chemical vapor deposition (CVD) process has been often used as an interlayer insulating film in a semiconductor device or the like. In recent years, for the purpose of forming a more uniform interlayer insulating film, a coating-type insulating film mainly comprising a hydrolysis product of a tetraalkoxysilane, called an SOG (spin-on-glass) film, has come into use. Also, along with higher integration of a semiconductor device or the like, a low-dielectric interlayer insulating film mainly comprising a polyorganosiloxane, called an organic SOG, has been developed.

Under these circumstances, a method of forming pores by adding, in an ethanol, a surfactant to a polyorgano-siloxane obtained from a cyclic carbosilane, so as to more reduce the dielectric constant, is known (Science, Vol. 302, page 266 (2003)). However, this method has a problem that a uniform coat can be hardly formed and a film cannot be stably produced.

SUMMARY OF THE INVENTION

An object of the present invention is to provide a composition capable of forming a uniform coat; an insulating film having a good surface state and a low dielectric constant; and a production method of the insulating film. (An "insulating film" is also referred to as a "dielectric film" or a "dielectric insulating film", and these terms are not substantially distinguished.)

The above-described object of the present invention can be attained by the following means.

(1) An insulating film-forming composition comprising:
at least one of a compound represented by formula (1), a hydrolysate of the compound represented by formula (1) and a condensate of the compound represented by formula (1); and
at least one solvent,
wherein the at least one solvent contains an organic solvent(s) having a boiling point of 85 to 250° C. in an amount of 25 mass % or more:

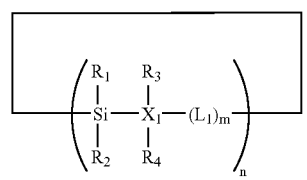

(1)

wherein $R_1$, $R_2$, $R_3$ and $R_4$ each independently represents a hydrogen atom or a substituent, provided that at least one of $R_1$ and $R_2$ represents a hydrolyzable group;

$X_1$ represents a carbon atom or a silicon atom;

$L_1$ represents a divalent linking group;

m represents 0 or 1; and n represents an integer of 3 to 5 when m is 0, and represents an integer of 2 to 3 when m is 1.

(2) The insulating film-forming composition as described in (1) above,
wherein $X_1$ is a carbon atom, and $L_1$ is an alkylene group.

(3) The insulating film-forming composition as described in (1) above,
wherein m is 0.

(4) The insulating film-forming composition as described in any of (1) to (3) above, which further comprises an organic silicon compound represented by formula (A) or a polymer of the organic silicon compound represented by formula (A):

(A)

wherein $R_a$ represents an alkyl group, an aryl group or a heterocyclic group;

$R_b$ represents a hydrogen atom, an alkyl group, an aryl group or a silyl group, and $R_a$ and $R_b$ each may further has a substituent; and q represents an integer of 0 to 3, and when q or 4-q is 2 or more, $R_a$'s or $R_b$'s may be the same or different.

(5) The insulating film-forming composition as described in (4) above,
wherein q is an integer of 0 to 2, and $R_b$ is an alkyl group.

(6) The insulating film-forming composition as described in any of (1) to (5) above,
wherein the organic solvent(s) has at least one of an ether group, an ester group and a carbonyl group.

(7) The insulating film-forming composition as described in any of (1) to (6) above, which further comprises an inorganic protonic acid or an organic protonic acid.

(8) The insulating film-forming composition as described in any of (1) to (7) above, which further comprises water.

(9) The insulating film-forming composition as described in any of (1) to (8) above, which further comprises a surfactant.

(10) An insulating film formed from an insulating film-forming composition as described in any of (1) to (9) above.

(11) A method for producing an insulating film, comprising:
coating a composition as described in any of (1) to (9) above on a substrate; and
subjecting the coated composition to a heat treatment.

DETAILED DESCRIPTION OF THE INVENTION

As described above, the insulating film-forming composition of the present invention is characterized by comprising a silane compound represented by formula (1) and a specific organic solvent. When this composition is used, a uniform coat can be stably formed and an insulating film having a very low relative dielectric constant can be obtained.

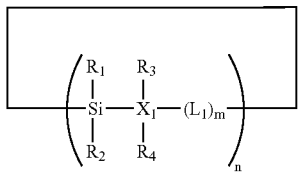
(1)

wherein $R_1$, $R_2$, $R_3$ and $R_4$ each independently represents a hydrogen atom or a substituent, provided that at least one of $R_1$ and $R_2$ represents a hydrolyzable group, $X_1$ represents a carbon atom or a silicon atom, $L_1$ represents a divalent linking group, m represents 0 or 1, and n represents an integer of 3 to 5 when m is 0, and represents an integer of 2 to 3 when m is 1.

In formula (1), $R_1$ to $R_4$ each independently represents a hydrogen atom or a substituent.

The substituent represented by $R_1$ to $R_4$ is preferably, for example, a halogen atom (fluorine, chlorine, bromine or iodine), a linear, branched or cyclic alkyl group having a carbon number of 1 to 10 (e.g., methyl, tert-butyl, cyclopentyl, cyclohexyl), an alkenyl group having a carbon number of 2 to 10 (e.g., vinyl, propenyl), an alkynyl group having a carbon number of 2 to 10 (e.g., ethynyl, phenylethynyl), an aryl group having a carbon number of 6 to 20 (e.g., phenyl, 1-naphthyl, 2-naphthyl), an acyl group having a carbon number of 2 to 10 (e.g., benzoyl), an alkoxy group having a carbon number of 1 to 10 (e.g., methoxy, ethoxy, i-propoxy, tert-butoxy), a silyloxy group having a carbon number of 3 to 10 (e.g., trimethylsilyloxy, triethylsilyloxy, tert-butyldimethylsilyloxy), an aryloxy group having a carbon number of 6 to 20 (e.g., phenoxy), an acyloxy group having a carbon number of 2 to 10 (e.g., acetyloxy, ethylcarbonyloxy), or a hydroxyl group.

The substituent is more preferably chlorine atom, a linear, branched or cyclic alkyl group having a carbon number of 1 to 5, an alkenyl group having a carbon number of 2 to 5, an alkynyl group having a carbon number of 2 to 5, or an alkoxy group having a carbon number of 1 to 5.

These substituents each may be further substituted by another substituent.

At least one of $R_1$ and $R_2$ is a hydrolyzable group. Examples of the hydrolyzable group as $R_1$ and $R_2$ include a halogen atom, an alkoxy group, an aryloxy group, an acyloxy group and a silyloxy group.

$R_1$ and $R_2$ each is preferably a substituted or unsubstituted alkoxy group (e.g., methoxy, ethoxy, propoxy, butoxy, methoxyethoxy), and most preferably an unsubstituted alkoxy group having a carbon number of 1 to 5.

As for the substituents represented by $R_1$ to $R_4$, the same or different substituents may be linked to each other to form a multimer or a ring. The ring formed is preferably a 5-, 6-, 7- or 8-membered ring, more preferably a 5- or 6-membered ring.

$X_1$ represents a carbon atom or a silicon atom but is preferably a carbon atom.

$L_1$ represents a divalent linking group, and examples of the linking group include an alkylene group, an alkenylene group, an arylene group, —O—, —S—, —SiRR'— (wherein R and R' each represents an alkyl group or an aryl group), or a linking group comprising a combination of two or more thereof. Among these, a methylene group, an ethylene group and a vinylene group are preferred.

m represents 0 or 1. m is preferably 0.

When m is 0, n represents an integer of 3 to 5. When m is 1, n represents an integer of 2 to 3.

In n repeating units, the plurality of $R_1$'s, $R_2$'s, $R_3$'s, $R_4$'s, $X_1$'s or $L_1$'s may be the same or different groups.

The compound may also take a structure where the compounds represented by formula (1) are linked through a single bond or a linking group.

Specific examples of formula (1) are set forth below, but the present invention is not limited thereto.

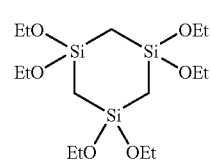
1-1

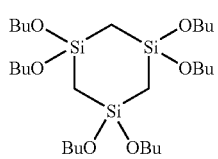
1-2

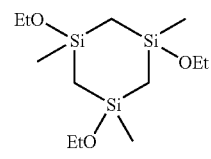
1-3

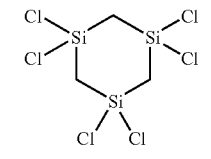
1-4

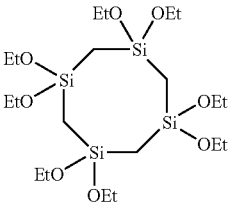
1-5

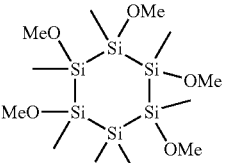
1-6

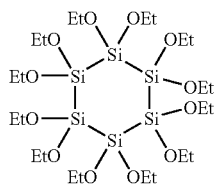
1-7

1-8

-continued

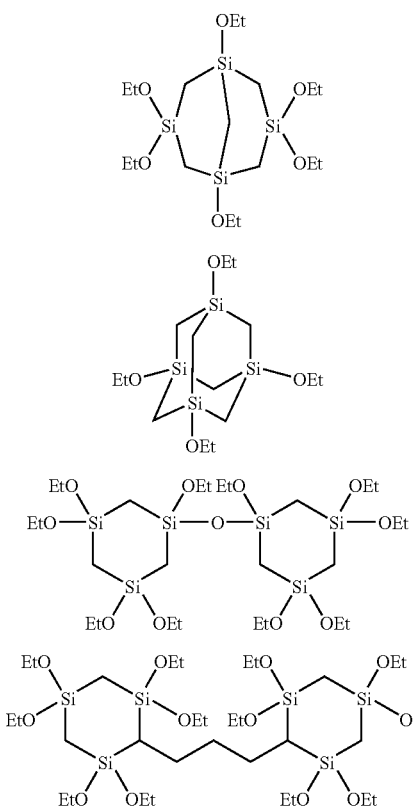

The molecular weight of the compound represented by formula (1) is generally from 200 to 1,000, preferably from 250 to 900.

The compound represented by formula (1) can be easily prepared by using a technique widely known in the silicon chemistry. For example, the compound can be synthesized by the method described in Tetrahedron Letters, Vol. 34, No. 13, page 2111 (1993).

In the insulating film-forming composition of the present invention, one of these compounds represented by formula (1) may be used alone, or two or more thereof may be used in combination.

Also, together with the compound represented by formula (1), a known silicon compound (e.g., tetramethoxy-silane, tetraethoxysilane, methyltrimethoxysilane, methyl-triethoxysilane) added to an insulating film-forming composition may be used in combination.

Examples of the another silane compound which may be added, if desired, for enhancing the film properties of the material include an organic silicon compound represented by the following formula (A) or a polymer using this compound as a monomer. Here, the meaning of the polymer includes a hydrolysate and/or a partial condensate of the organic silicon compound represented by the following formula (A).

$$(R_a)_q—Si—(OR_b)_{4-q} \quad (A)$$

In formula (A), $R_a$ represents an alkyl group, an aryl group or a heterocyclic group, and $R_b$ represents a hydrogen atom, an alkyl group, an aryl group or a silyl group. These groups each may further have a substituent.

q represents an integer of 0 to 3 and when q or 4-q is 2 or more, $R_a$'S or $R_b$'s may be the same or different. Also, the compounds may be linked to each other through the substituent $R_a$ or $R_b$ to form a multimer.

q is preferably an integer of 0 to 2, and $R_b$ is preferably an alkyl group. When q is 0, preferred examples of the compound include tetramethoxysilane (TMOS) and tetraethoxysilane (TEOS). Also, when q is 1 or 2, preferred examples of the compound include the following compounds.

Me—Si(OEt)₃ (A-1)

Me—Si(OMe)₃ (A-2)

n-C₃H₇—Si—(OEt)₃ (A-3)

n-C₆H₁₃—Si—(OEt)₃ (A-4)

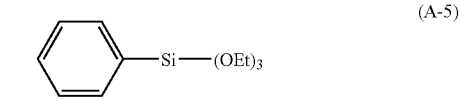 (A-5)

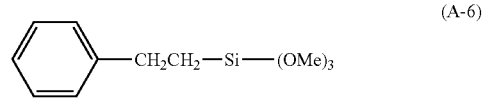 (A-6)

(EtO)₃—Si—(CH₂)₂—Si—(OEt)₃ (A-7)

Me(EtO)₂—Si—(CH₂)₂—Si—(OEt)₂Me (A-8)

In the case where another silane compound such as a compound represented by formula (A) is used in combination, the another silane compound is preferably used in the range from 1 to 200 mol %, more preferably from 10 to 100 mol %, based on the compound represented by formula (1).

Using the compound represented by formula (1) and, if desired, using another silane compound in combination, a hydrolysate or a condensate is obtained by a so-called sol-gel reaction.

At the hydrolysis and condensation of the compound represented by formula (1), water is preferably added in an amount of 0.5 to 150 mol, more preferably from 1 to 100 mol %, per mol of the total amount of the silane compound comprising the compound represented by formula (1) and containing, if desired, another compound. The amount of water added is preferably 0.5 mol or more in view of the surface state and preferably 150 mol or less from the standpoint of preventing precipitation or gelation of polymer during the hydrolysis and condensation reaction.

At the hydrolysis and condensation of the compound represented by formula (1), an acid catalyst or a metal chelate compound is preferably used.

The acid catalyst is preferably an inorganic or organic protonic acid. Examples of the inorganic protonic acid include hydrochloric acid, sulfuric acid, hydrofluoric acid, phosphoric acids (e.g., H₃PO₄, H₃PO₃, H₄P₂O₇, H₅P₃O₁₀, metaphosphoric acid, hexafluorophosphoric acid), boric acid, nitric acid, perchloric acid, tetrafluoroboric acid, hexafluoroarsenic acid, hydrobromic acid and solid acids such as tungstophosphoric acid and tungsten peroxo complex. The inorganic protonic acid is preferably hydrochloric acid, nitric acid, sulfuric acid or phosphoric acid, more preferably hydrochloric acid or nitric acid.

Examples of the organic protonic acid include a low molecular compound such as carboxylic acids (for example, oxalic acid, acetic acid, propionic acid, butanoic acid, pentanoic acid, hexanoic acid, heptanoic acid, octanoic acid, nonanoic acid, decanoic acid, maleic acid, methyl-malonic acid, adipic acid, sebacic acid, gallic acid, butyric acid, mellitic acid, arachidic acid, shikimic acid, 2-ethylhexanoic acid, oleic acid, stearic acid, linolic acid, linoleic acid, salicylic acid, monochloroacetic acid, dichloroacetic acid, trichloroacetic acid, p-aminobenzoic acid, formic acid, malonic acid, phthalic acid, fumaric acid, citric acid, tartaric acid, succinic acid, fumaric acid, itaconic acid, mesaconic acid, citraconic acid, malic acid, a hydrolysate of glutaric acid, a hydrolysate of maleic anhydride, a hydrolysate of phthalic anhydride, trifluoroacetic acid, benzoic acid and a substituted benzoic acid), phosphoric esters (for example, those having a C number of 1 to 30, such as methyl phosphate, propyl phosphate, dodecyl phosphate, phenyl phosphate, dimethyl phosphate and didodecyl phosphate), phosphorous acid esters (for example, those having a C number of 1 to 30, such as methyl phosphite, dodecyl phosphite, diethyl phosphite, diisopropyl phosphite and didodecyl phosphite), sulfonic acids (for example, those having a C number of 1 to 15, such as benzenesulfonic acid, toluenesulfonic acid, hexa-fluorobenzenesulfonic acid, trifluoromethanesulfonic acid and dodecylsulfonic acid), carboxylic acids (for example, oxalic acid, acetic acid, trifluoroacetic acid, benzoic acid and a substituted benzoic acid), imides (for example, bis(trifluoromethanesulfonyl)imide acid and trifluoro-methanesulfonyl trifluoroacetamide), and phosphonic acids (for example, those having a C number of 1 to 30, such as methylphosphonic acid, ethylphosphonic acid, phenyl-phosphonic acid, diphenylphosphonic acid and 1,5-naphthalenebisphosphonic acid); and a polymer compound having a protonic acid moiety, such as perfluorocarbon sulfonic acid polymer represented by Nafion, poly-(meth)acrylate having a phosphoric acid group in the side chain (JP-A-2001-114834), sulfonated polyether ether ketone (JP-A-6-93111), sulfonated polyether sulfone (JP-A-10-45913) and sulfonated polysulfone (JP-A-9-245818).

The organic protonic acid is preferably a carboxylic acid.

The amount of this catalyst used is, as the total amount, usually from 0.00001 to 10 mol, preferably from 0.00005 to 5 mol, per mol of the silane compound such as the compound represented by formula (1). When the amount of the catalyst used is in this range, precipitation or gelation of polymer less occurs during the reaction.

At the hydrolysis and condensation of the compound represented by formula (1), the temperature is usually from 0 to 100° C., preferably from 10 to 90° C., and the time is usually from 5 minutes to 200 hours, preferably from 10 minutes to 40 hours.

The solvent used for the hydrolysis and condensation is not particularly limited as long as it dissolves the silane compound which is a solute, but preferred examples of the solvent which can be used include ketones (e.g., cyclohexanone, cyclopentanone, 2-heptanone, methyl isobutyl ketone, methyl ethyl ketone, acetone), carbonate compounds (e.g., ethylene carbonate, propylene carbonate), heterocyclic compounds (e.g., 3-methyl-2-oxazolidinone, dimethylimidazolidinone, N-methylpyrrolidone), cyclic ethers (e.g., dioxane, tetrahydrofuran), chain ethers (e.g., diethyl ether, ethylene glycol dimethyl ether, propylene glycol dimethyl ether, tetraethylene glycol dimethyl ether, polyethylene glycol dimethyl ether, ethylene glycol monomethyl ether, ethylene glycol monoethyl ether, propylene glycol monomethyl ether (PGME), triethylene glycol monobutyl ether, propylene glycol monopropyl ether, triethylene glycol monomethyl ether), alcohols (e.g., methanol, ethanol), polyhydric alcohols (e.g., ethylene glycol, propylene glycol, polyethylene glycol, polypropylene glycol, glycerin), nitrile compounds (e.g., acetonitrile, glutarodinitrile, methoxyacetonitrile, propionitrile, benzonitrile), esters (e.g., ethyl acetate, butyl acetate, methyl lactate, ethyl lactate, methyl methoxypropionate, ethyl ethoxypropionate, methyl pyruvate, ethyl pyruvate, propyl pyruvate, 2-methoxyethyl acetate, ethylene glycol monoethyl ether acetate, propylene glycol monomethyl ether acetate (PGMEA), γ-butyrolactone, phosphoric acid ester, phosphonic acid ester), aprotic polar substances (e.g., dimethyl sulfoxide, sulfolane, N,N-dimethylformamide, dimethylacetamide), nonpolar solvents (e.g., toluene, xylene, mesitylene), chlorine-based solvents (e.g., methylene dichloride, ethylene dichloride), diisopropylbenzene, and water.

Among these, preferred are ethers such as propylene glycol monopropyl ether and propylene glycol monomethyl ether; esters such as propylene glycol monomethyl ether acetate (PGMEA) and γ-butyrolactone; carbonates such as ethylene carbonate; ketones such as cyclohexanone; aprotic polar substances; cyclic ethers such as tetrahydrofuran; nonpolar solvents; and water. One of these solvents may be used alone, or two or more thereof may be used in combination.

Among these solvents, more preferred are propylene glycol monomethyl ether acetate, propylene glycol mono-methyl ether, 2-heptanone, cyclohexanone, γ-butyrolactone, ethylene glycol monomethyl ether, ethylene glycol monoethyl ether, ethylene glycol monoethyl ether acetate, propylene glycol monomethyl ether, propylene glycol monoethyl ether, ethylene carbonate, butyl acetate, methyl lactate, ethyl lactate, methyl methoxypropionate, ethyl ethoxypropionate, N-methylpyrrolidone, N,N-dimethylformamide, tetrahydrofuran, methyl isobutyl ketone, xylene, mesitylene and diisopropylbenzene.

[Composition]

The composition of the present invention is usually prepared by dissolving at least any one of the compound itself represented by formula (1), and a hydrolysate and a condensate prepared above of the compound represented by formula (1), in an organic solvent. The solvent at the preparation of this composition may be the same as or different from the solvent used for the hydrolysis and condensation.

In order to obtain a homogeneous film, the organic solvent of this organic solvent is preferably from 85 to 250° C. Also, in view of low dielectric constant, the solvent is preferably a solvent having an ether group, an ester group or a carbonyl group within the molecule.

From these standpoints, preferred examples of the solvent include propylene glycol monomethyl ether acetate, propylene glycol monomethyl ether, 2-heptanone, cyclo-hexanone, γ-butyrolactone, ethylene glycol monomethyl ether, ethylene glycol monoethyl ether, ethylene glycol monoethyl ether acetate, propylene glycol monoethyl ether, diethylene glycol dimethyl ether, diethylene glycol diethyl ether, butyl acetate, methyl lactate, ethyl lactate, methyl methoxypropionate, ethyl ethoxypropionate, N-methyl-pyrrolidone, N,N-dimethylformamide and methyl isobutyl ketone.

The amount of such a preferred organic solvent used is 25 mass % or more, preferably 30 mass % or more, more preferably 50 mass % or more, based on the entire solvent amount including other organic solvents. (In this specification, mass ratio is equal to weight ratio.)

The entire solid content concentration of the composition of the present invention is preferably from 2 to 30 mass %, and this concentration is appropriately adjusted according to the intended purpose. When the entire solid content concentration of the composition is from 2 to 30 mass %, the coat can have an appropriate film thickness, and the composition can have higher storage stability.

The composition of the present invention is coated, dried and preferably heated, whereby a good insulating material can be formed. Particularly, a good insulating film can be provided.

In coating the composition of the present invention on a substrate such as silicon wafer, $SiO_2$ wafer and SiN wafer, coating means such as spin coating, dipping, roll coating and spraying is employed.

At this time, as for the film thickness, a coat having a dry thickness of approximately from 0.05 to 1.5 µm by single coating or approximately from 0.1 to 3 µm by double coating can be formed. Thereafter, the coat is dried at an ordinary temperature or heated at a temperature of approximately from 80 to 600° C., usually on the order of 5 to 240 minutes, whereby an insulating film comprising a vitreous polymer, a macropolymer or a mixture thereof can be formed. The heating method used here may be a hot plate, an oven, a furnace or the like. As for the heating atmosphere, the heating may be performed, for example, under atmospheric pressure, in a nitrogen or argon atmosphere, in vacuum or under reduced pressure with a controlled oxygen concentration.

More specifically, the composition of the present invention is coated on a substrate (usually a substrate with metal wiring) by, for example, spin coating, and the coat is subjected to a first heat treatment at a temperature of 300° C. or less, thereby not only drying the solvent but also crosslinking siloxane contained in the composition, and then to a second heat treatment (annealing) at a temperature of more than 300° C. but 450° C. or less (preferably from 330 to 400° C.) generally for from 1 minute to 10 hours, whereby an insulating film having a low dielectric constant can be formed.

The film is preferably made porous by adding a pore-forming agent such as surfactant to the composition of the present invention, so as to more reduce the dielectric constant. The surfactant is preferably added in advance at the hydrolysis and condensation of the compound represented by formula (1).

Examples of the surfactant include a nonionic surfactant and a quaternary ammonium salt-type surfactant, with a quaternary ammonium salt-type surfactant being preferred. Preferred examples of the quaternary ammonium salt-type surfactant include those described in JP-A-2004-307694.

The pore-forming agent content is preferably from 5 to 80%, more preferably from 10 to 70%, still more preferably from 15 to 60%, based on the entire mass of solid matters in the composition of the present invention.

On the insulating film formed of the composition of the present invention, another insulating film such as silicon oxide film may be formed by, for example, a chemical vapor deposition method. This is effective for blocking the insulating film formed by the present invention from the outside air and suppressing the reduction of hydrogen or fluorine remaining in the film. Furthermore, this another insulating film is also effective for preventing the insulating film by the present invention from damaging in the treatments in subsequent steps (for example, a flattening treatment by CMP).

EXAMPLES

The present invention is described in greater detail below by referring to Examples, but the present invention is limited to these Examples.

Synthesis Example 1

Synthesis of Compound 1-1

Compound 1-1 was synthesized by using the method described in Tetrahedron Letters, Vol. 34, No. 13, page 2111 (1993).

Synthesis Example 2

Synthesis of Film-Forming Composition E-1

A mixture containing 0.5 ml of an aqueous 0.1 M hydrochloric acid solution and 1 ml of water was added dropwise to a solution obtained by dissolving 1.0 g of Compound (1-1) and 0.346 g of cetyltrimethylammonium chloride in 3.7 g of propylene glycol monomethyl ether and 1.23 g of ethanol. After the completion of dropwise addition, the reaction was allowed to proceed for 30 minutes to produce Compound E-1 of the present invention.

Synthesis Example 3

Synthesis of Film-Forming Composition E-2

Composition E-2 was produced in the same manner as in Synthesis Example 2 except for changing the solvents used in Synthetic Example 2 to 2.47 g of propylene glycol monomethyl ether and 2.47 g of ethanol.

Synthesis Example 4

Synthesis of Composition C-1 for Comparison

Composition E-2 was produced in the same manner as in Synthesis Example 2 except for changing the solvents used in Synthesis Example 2 to 0.98 g of propylene glycol monomethyl ether and 3.94 g of ethanol.

Synthesis Example 5

Synthesis of Composition C-2 for Comparison

Composition E-2 was produced in the same manner as in Synthesis Example 2 except for changing the solvents used in Synthesis Example 2 to 4.93 g of ethanol.

Synthesis Example 6

Synthesis of Film-Forming Composition E-3

Composition E-2 was produced in the same manner as in Synthesis Example 2 except for changing the aqueous hydrochloric acid solution used in Synthesis Example 2 to 0.5 ml of an aqueous 0.1 M nitric acid solution.

Synthesis Example 7

Synthesis of Film-Forming Composition E-4

A mixture containing 0.5 ml of an aqueous 0.1 M nitric acid solution and 1 ml of water was added dropwise to a solution obtained by dissolving 0.5 g of Compound (1-1), 1.01 g of tetraethoxysilane and 0.173 g of cetyl-trimethylammonium in 3.7 g of propylene glycol monomethyl ether and 1.23 g of ethanol. After the completion of dropwise addition, the reaction was allowed to proceed for 30 minutes to produce Compound E-4 of the present invention.

Synthesis Example 8

Synthesis of Film-Forming Composition E-5

A mixture containing 0.5 ml of an aqueous 0.1 M nitric acid solution and 1 ml of water was added dropwise to a solution obtained by dissolving 1 g of Compound (1-1) in 3.7 g of propylene glycol monomethyl ether and 1.23 g of ethanol. After the completion of dropwise addition, the reaction was allowed to proceed for 30 minutes to produce Compound E-5 of the present invention.

Synthesis Example 9

Synthesis of Composition C-3 for Comparison

Composition C-3 was produced in the same manner as in Synthesis Example 8 except for changing the solvents used in Synthesis Example 8 to 4.93 g of ethanol.

[Production of Insulating Film]

The composition prepared above each was spin-coated on a silicon substrate to a film thickness of 4,000 Å, and the substrate was dried on a hot plate at 150° C. for 1 minute to remove the solvent. Subsequently, the silicon substrate after drying was transferred to a clean oven and heat-treated at 400° C. over 30 minutes in nitrogen with an oxygen concentration of 10 ppm to form an insulating film.

[Evaluation of Surface State]

The surface state of each insulating film was observed through an optical microscope at a magnification of 50 or 1,500 times and evaluated as follows.

A: Surface irregularity or particle was not observed and no problem.

B: Several surface irregularities or particles were observed.

C: Many surface irregularities or particles were observed over the entire film.

[Measurement of Relative Dielectric Constant]

After allowing the insulating film obtained above to stand for 24 hours under the conditions of a temperature of 24° C. and a humidity of 50%, the relative dielectric constant was measured at 1 MHz by using a mercury probe manufactured by Four Dimension and an LCR meter HP4285A manufactured by Hewlett-Packard (measurement temperature: 25° C.)

The evaluation results of the surface state and the measurement results of the relative dielectric constant are shown in Table 1.

TABLE 1

|  | Composition | Relative Dielectric Constant | Surface State |
|---|---|---|---|
| Example 1 | E-1 | 2.22 | A |
| Example 2 | E-2 | 2.24 | A |
| Comparative Example 1 | C-1 | 2.31 | B |
| Comparative Example 2 | C-2 | 2.35 | C |
| Example 3 | E-3 | 2.23 | A |
| Example 4 | E-4 | 2.26 | A |
| Example 5 | E-5 | 2.65 | A |
| Comparative Example 3 | C-3 | 2.80 | C |

It is seen that the insulating films of Examples according to the present invention have a good surface state and a small dielectric constant.

According to the present invention, an insulating film having a low dielectric constant, which is suitable for use as an interlayer insulating film in a semiconductor device or the like, can be stably formed.

The entire disclosure of each and every foreign patent application from which the benefit of foreign priority has been claimed in the present application is incorporated herein by reference, as if fully set forth.

What is claimed is:

1. An insulating film-forming composition comprising:
at least one of a compound represented by formula (1), a hydrolysate of the compound represented by formula (1) and a condensate of the compound represented by formula (1); and
at least one solvent,
wherein the at least one solvent contains an organic solvent (s) having a boiling point of 85 to 250° C. in an amount of 25 mass % or more:

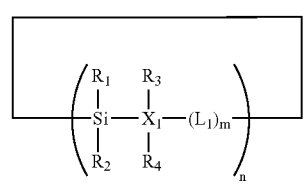

(1)

wherein $R_1$, $R_2$, $R_3$ and $R_4$ each independently represents a hydrogen atom or a substituent, provided that at least one of $R_1$ and $R_2$ represents a hydrolyzable group; and the substituent represented by $R_1$ to $R_4$ is a halogen atom, a linear, branched or cyclic alkyl group having a carbon number of 1 to 10, an alkenyl group having a carbon number of 2 to 10, an alkynyl group having a carbon number of 2 to 10, an aryl group having a carbon number of 6 to 20, an acyl group having a carbon number of 2 to 10, an alkoxy group having a carbon number of 1 to 10, a silyloxy group having a carbon number of 3 to 10, an aryloxy group having a carbon number of 6 to 20, an acyloxy group having a carbon number of 2 to 10, or a hydroxyl group;

$X_1$ represents a carbon atom or a silicon atom;

$L_1$ represents a divalent linking group;

m represents 0 or 1; and n represents an integer of 3 to 5 when m is 0, and represents an integer of 2 to 3 when m is 1.

2. The insulating film-forming composition according to claim 1, wherein $X_1$ is a carbon atom, and $L_1$ is an alkylene group.

3. The insulating film-forming composition according to claim 1, wherein m is 0.

4. The insulating film-forming composition according to claim 1, which further comprises an organic silicon compound represented by formula (A) or a polymer of the organic silicon compound represented by formula (A):

(A)

wherein $R_a$ represents an alkyl group, an aryl group or a heterocyclic group;

$R_b$ represents a hydrogen atom, an alkyl group, an aryl group or a silyl group, and $R_a$ and $R_b$ each may further has a substituent; and q represents an integer of 0 to 3, and when q or 4-q is 2 or more, $R_a$'s or $R_b$'s may be the same or different.

5. The insulating film-forming composition according to claim 4, wherein q is an integer of 0 to 2, and $R_b$ is an alkyl group.

6. The insulating film-forming composition according to claim 1, wherein the organic solvent(s) has at least one of an ether group, an ester group and a carbonyl group.

7. The insulating film-forming composition according to claim 1, which further comprises an inorganic protonic acid or an organic protonic acid.

8. The insulating film-forming composition according to claim 1, which further comprises water.

9. The insulating film-forming composition according to claim 1, which further comprises a surfactant.

10. An insulating film formed from an insulating film-forming composition according to claim 1.

11. A method for producing an insulating film, comprising:
coating a composition according to claim 1 on a substrate; and
subjecting the coated composition to a heat treatment.

* * * * *